(12) United States Patent
Njie

(10) Patent No.: US 11,837,674 B2
(45) Date of Patent: Dec. 5, 2023

(54) POLY-LAYERED, POLY-DIMENSIONAL SOLAR-STACK STRUCTURE

(71) Applicant: Mohammed Alboury Njie, Frisco, TX (US)

(72) Inventor: Mohammed Alboury Njie, Frisco, TX (US)

(*) Notice: Subject to any disclaimer, the term of this patent is extended or adjusted under 35 U.S.C. 154(b) by 0 days.

(21) Appl. No.: 17/668,465

(22) Filed: Feb. 10, 2022

(65) Prior Publication Data

US 2022/0344526 A1 Oct. 27, 2022

Related U.S. Application Data

(60) Provisional application No. 63/246,510, filed on Sep. 21, 2021, provisional application No. 63/148,066, filed on Feb. 10, 2021.

(51) Int. Cl.
*H01L 31/043* (2014.01)
*H01L 31/054* (2014.01)
*H01L 31/048* (2014.01)

(52) U.S. Cl.
CPC .......... *H01L 31/043* (2014.12); *H01L 31/048* (2013.01); *H01L 31/0543* (2014.12); *H01L 31/0547* (2014.12)

(58) Field of Classification Search
CPC . H01L 31/043; H01L 31/048; H01L 31/0543; H01L 31/0547; F24S 23/30; F24S 23/70; H02S 40/22
See application file for complete search history.

(56) References Cited

U.S. PATENT DOCUMENTS

| 5,575,860 A * | 11/1996 | Cherney | H01L 31/0543 |
| | | | 136/246 |
| 8,991,117 B1 | 3/2015 | Walker et al. | |
| 2010/0089436 A1* | 4/2010 | Watters | H01L 31/0547 |
| | | | 136/246 |
| 2010/0263709 A1* | 10/2010 | Norman | F24S 30/452 |
| | | | 136/246 |
| 2015/0043200 A1 | 2/2015 | Wilson | |
| 2019/0371684 A1 | 12/2019 | Vronsky et al. | |
| 2020/0358392 A1* | 11/2020 | Kiefer, III | H02S 40/38 |

FOREIGN PATENT DOCUMENTS

CN 206619605 U 11/2017

OTHER PUBLICATIONS

PCT Search Report and Written Opinion (dated May 16, 2022).

* cited by examiner

*Primary Examiner* — Mayla Gonzalez Ramos
(74) *Attorney, Agent, or Firm* — Kirby Drake

(57) ABSTRACT

A poly-layered, poly-dimensional solar photovoltaic stack structure may be provided in a tower form. A plurality of solar panels may be stacked on top of one another to create a solar stack tower. Using the solar stack tower, reflection, refraction, diffusion, and transportation of light may transmit photons from a higher area of photon saturation to a lower area of photon saturation. The solar stack tower may provide an enclosed structure, protecting and insulating the solar panels from heat, moisture, dust, and other elements that usually damage solar panels over time.

20 Claims, 16 Drawing Sheets

SIDE VIEW

KEY

① LIGHT RAY ④ SOLAR PANEL
② REFRACTED RAY
③ REFRACTING LENS

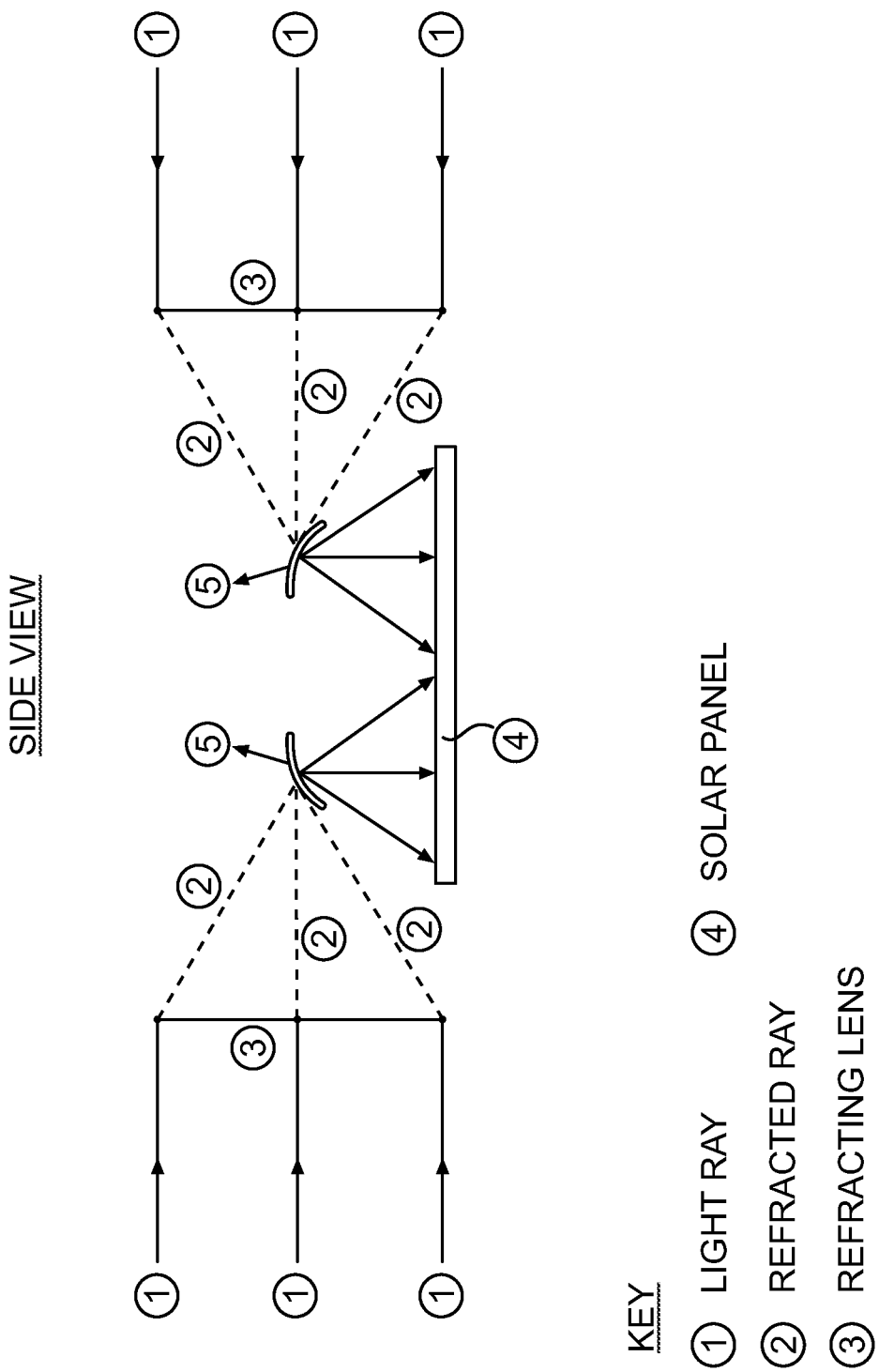

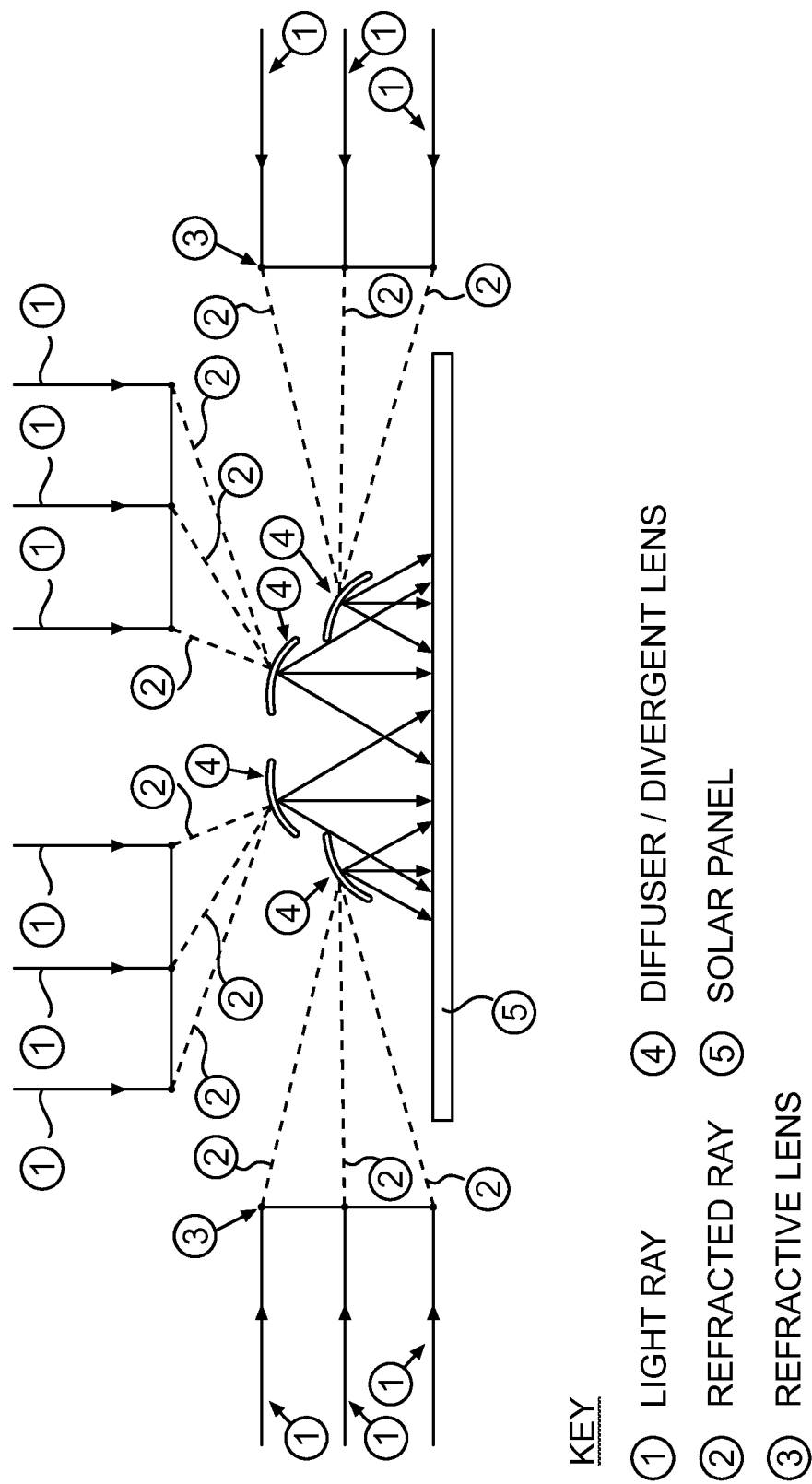

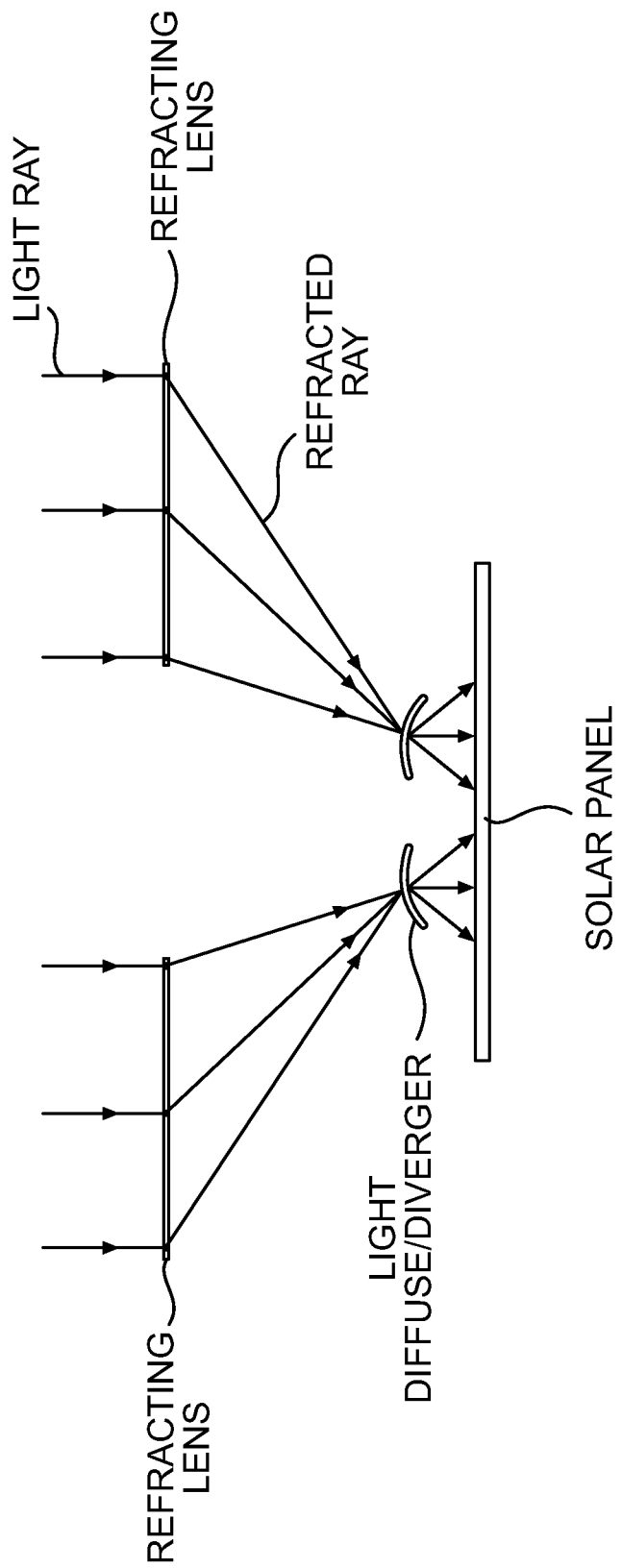

② SOLAR PANEL
③ INCIDENT RAY
④ REFRACTIVE LENS RAY

POLY-LAYERED, POLY-DIMENSIONAL SOLAR-STACK STRUCTURE

CROSS-REFERENCE TO RELATED APPLICATION

The present application is a non-provisional of, and claims priority to, U.S. Patent Application No. 63/246,510 filed Sep. 21, 2021, and U.S. Patent Application No. 63/148,066 filed Feb. 10, 2021, the disclosures of which are incorporated by reference in their entirety.

FIELD OF THE DISCLOSURE

The present disclosure generally relates to renewable energy generation, and more particularly, generation of renewable energy through a poly-layered and poly-dimensional solar structure, where multiple panels can be stacked upon each other, to create a solar photovoltaic stack.

BACKGROUND

Energy generation remains a problem in that large land masses may be needed to generate renewable energy. Because large land masses are needed to generate this energy, the price associated with providing renewable energy can be higher. Further, with some types of renewable energy, such as solar energy, the lifespan of the solar panels that are used may be lower than desired. In addition, renewable energy is sometimes viewed as not being very portable.

SUMMARY

Embodiments of the present disclosure may use the reflection, refraction, diffusion, and transportation of light to transmit photons from a higher area of photon saturation to a lower area of photon saturation. This transmission may enable a poly-layered and poly-dimensional solar structure, where multiple panels can be stacked upon each other, to create a solar photovoltaic stack. Embodiments of the present disclosure may provide an enclosed structure, protecting and insulating the panels from heat, moisture, dust, and other elements that usually damage solar panels over time.

Embodiments of the present disclosure may provide a poly-layered, poly-dimensional solar stack tower comprising: a plurality of solar panels stacked on top of one another; at least one lens/refractor positioned in front of the plurality of solar panels to refract incoming light rays behind the at least one lens/refractor; and at least one reflector that reflects the incoming light rays in front of the at least one reflector, wherein the at least one lens/refractor and the at least one reflector enclose the plurality of solar panels to form the solar stack tower, and wherein the incoming light rays are both reflected and refracted toward the plurality of solar panels, thereby concentrating the light rays. The solar stack tower may be entirely solid state with no moving parts, or it may be dynamic. The plurality of solar panels may be monofacial or bifacial. The solar stack tower may provide an enclosed structure, protecting and insulating the plurality of solar panels from heat, moisture, dust, and other damaging elements. The tower may be portable. The tower also may include at least one side collector lens that converges light onto a bottom solar panel of the plurality of solar panels; and at least one top collector lens that converges light onto the bottom solar panel. The tower may utilize fiber optics to collect light from a top panel of the plurality of solar panels and distribute to the other panels of the plurality of solar panels. Each of the plurality of solar panels may include four fibers bundled together to transmit light. The tower also may include carbon capture technology to convert the tower to a net negative carbon producing technology, producing both clean, reliable, and resilient energy, while also removing carbon from the atmosphere.

Other embodiments of the present disclosure may provide a poly-layered, poly-dimensional solar stack tower comprising: a plurality of solar panels stacked on top of one another; and a plurality of reflectors forming a solar stack tower around the plurality of solar panels, wherein the plurality of reflectors reflect the incoming light rays in front of the plurality of reflectors. The tower may include a plurality of lenses/refractors positioned in front of the plurality of solar panels to refract incoming light rays behind the plurality of lenses/refractors, wherein the plurality of reflectors and the plurality of lenses/refractors enclose the plurality of solar panels to form the solar stack tower, and wherein the incoming light rays are both reflected and refracted toward the plurality of solar panels, thereby concentrating the light rays. The solar stack tower may be entirely solid state with no moving parts, or it may be dynamic. The plurality of solar panels may be monofacial or bifacial. The tower may be portable. The tower also may include at least one side collector lens that converges light onto a bottom solar panel of the plurality of solar panels; and at least one top collector lens that converges light onto the bottom solar panel. The tower may utilize fiber optics to collect light from a top panel of the plurality of solar panels and distribute to the other panels of the plurality of solar panels.

Further embodiments of the present disclosure may provide a poly-layered, poly-dimensional solar stack structure comprising: a plurality of solar panels stacked on top of one another; at least one lens/refractor to refract incoming light rays behind the at least one lens/refractor; and at least one reflector that reflects the incoming light rays in front of the at least one reflector, wherein the incoming light rays are both reflected and refracted toward the plurality of solar panels, thereby concentrating the light rays. The structure may be in tower form.

BRIEF DESCRIPTION OF THE DRAWINGS

For a more complete understanding of this disclosure, reference is now made to the following description, taken in conjunction with the accompanying drawings, in which:

FIG. 1 depicts photon collection from a side collector according to an embodiment of the present disclosure;

FIGS. 2A and 2B depict a side lens and a top lens working collectively according to an embodiment of the present disclosure;

DETAILED DESCRIPTION

Figure 3:
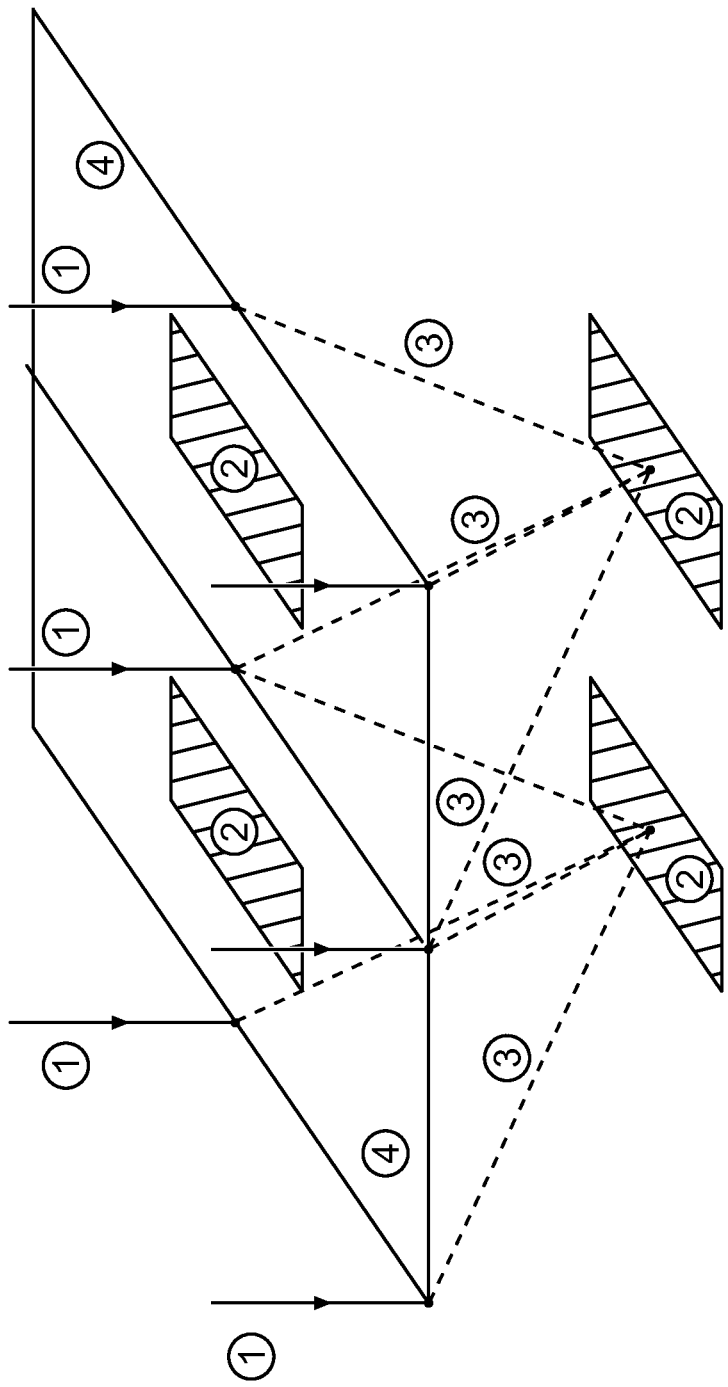
FIG. 3 depicts a plurality of levels of solar panels according to an embodiment of the present disclosure.

Embodiments of the present disclosure may provide a poly-layered, poly-dimensional solar photovoltaic stack structure, which may be in a tower form. A plurality of solar panels may be stacked on top of one another to create a solar stack tower according to embodiments of the present disclosure. Using the solar stack tower according to embodiments of the present disclosure, reflection, refraction, diffusion, and transportation of light may transmit photons from a higher area of photon saturation to a lower area of photon saturation. In embodiments of the present disclosure, the solar stack tower may provide an enclosed structure, protecting and insulating the solar panels from heat, moisture, dust, and other elements that usually damage solar panels over time.

Solar stack towers according to embodiments of the present disclosure may increase the energy density per meter squared, meaning that less land/area may be required to generate the same amount of energy, significantly reducing the large amount of land that is generally required to generate useful energy. Since land is one of the factors affecting solar panels, use of solar stack towers according to embodiments of the present disclosure may reduce the overall price of solar energy generation. Furthermore, since the solar panels utilized in solar stack towers in embodiments of the present disclosure are enclosed and insulated, the lifespan of the solar panels may be significantly increased, resulting in less maintenance costs, and even lower energy costs. The compact structure of a solar stack tower according to embodiments of the present disclosure also may allow solar panels to become more portable. This may provide additional applications for any activity that may require a portable energy source, as well as active energy generation mechanisms on vehicles of all kinds.

FIG. 1 depicts photon collection from a side collector according to an embodiment of the present disclosure. Light rays 1 may enter from the side and may be incident on refracting lens 3. Due to the refractive properties of transparent materials, light rays 1 may provide refracted rays 2 that may be converged to focal point 5. Focal point 5 may be where a divergent material is placed to spread light rays 1 onto solar panel 4. Accordingly, along with the light coming in from above, additional photons can be transmitted from the side, thereby increasing the overall number of photons that may be incident on solar panel 4.

FIGS. 2A and 2B depict a side lens and a top lens working collectively according to an embodiment of the present disclosure. Having the side lens and top lens working collectively may increase the amount of photons incident on solar panels 5. Light rays 1 may be at first converged to a single point at diffuser/divergent lens 4 and then diverged outward to one or more solar panels 5.

FIG. 3 depicts a plurality of levels of solar panels according to an embodiment of the present disclosure. Solar panels may be placed on top of each other to create a plurality of levels. To ensure that bottom solar panels 2 receive sufficient light, refractive lens 4 may be placed above bottom solar panels 2 to converge incident rays 3 onto a focal point. The focal length may provide where the bottom solar panels 2 should be placed to ensure that bottom solar panels 2 may receive light. A row of lenses 1 may be followed by a row of solar panels 2. Solar panels can be placed on top of each other, provided that the solar panel placed below another solar panel still may receive light. Accordingly, each row of solar panels may be followed by a row of lenses that may converge any incident rays to a focal point that may fall on the solar panels on the second row.

Figure 4:
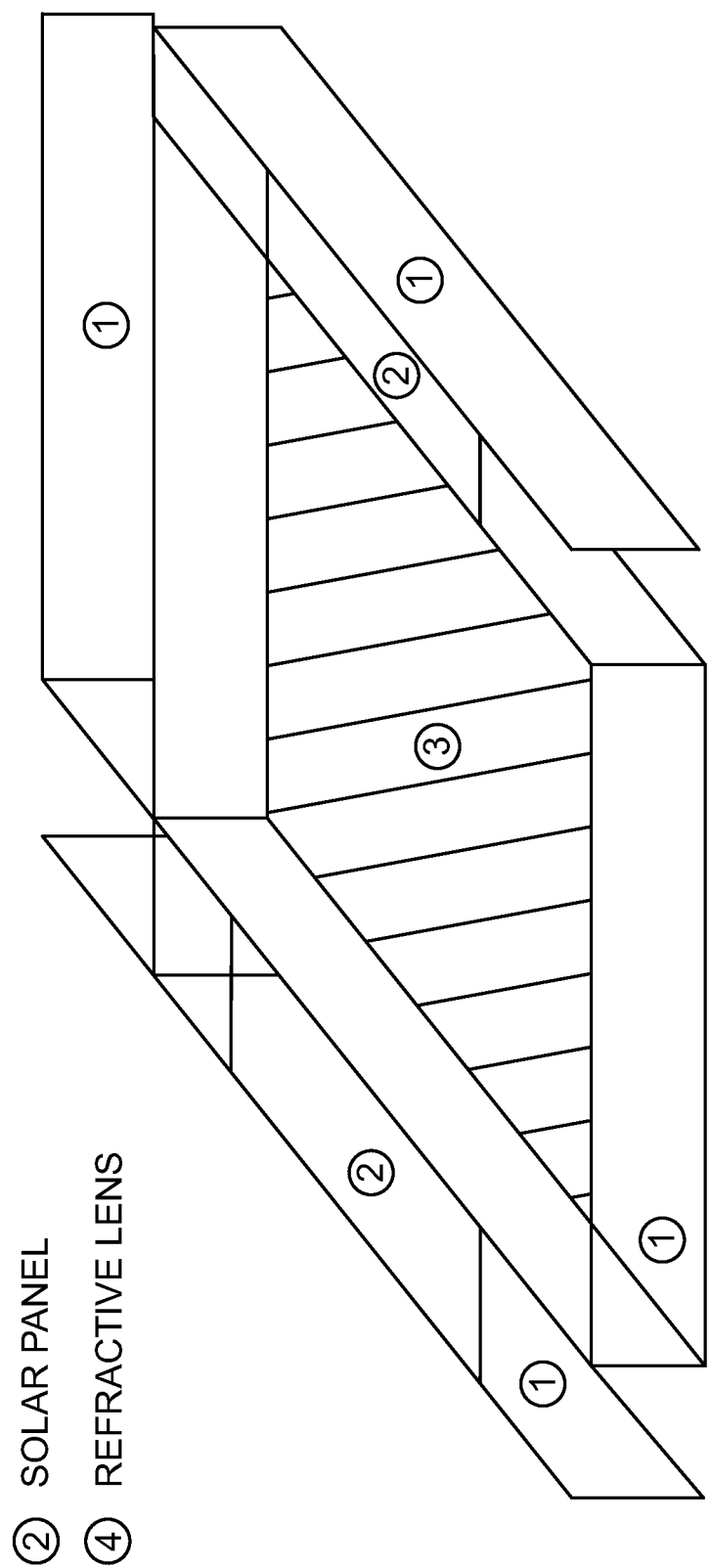
FIG. 4 depicts layers of a solar tower according to an embodiment of the present disclosure.

FIG. 4 depicts layers of a solar tower according to an embodiment of the present disclosure. A layer of a solar tower may include side collector lenses 1 that may converge light on bottom solar panel 3 and top collector lenses 2 that may converge light onto bottom solar panel 3. As depicted herein, side collector lenses may converge the incoming light rays to one focal point. By having both side collector lenses 1 and top collector lenses 2 transmitting light onto bottom solar panel 3, this may provide more than enough light for bottom solar panel 3 to produce useful energy in embodiments of the present disclosure. As the light rays become incident on a varying refractive index lens, each individual ray may maintain a constant refractive angle but a varying focal point. Accordingly, light may be refracted to multiple levels where the rays may fall on solar panels to create useful energy. In an embodiment of the present disclosure, seven layers of solar panels may be provided. However, it should be appreciated that more or fewer layers of solar panels may be provided within a solar stack tower without departing from the present disclosure. As previously described, the solar panels in the lower layers still may receive sufficient light even though they have other solar panels placed over/on top of them. This is because light and photons can be transported from one area to another. Light can be refracted and reflected to change its direction and take it from one area to another within the solar stack tower.

Figure 5:
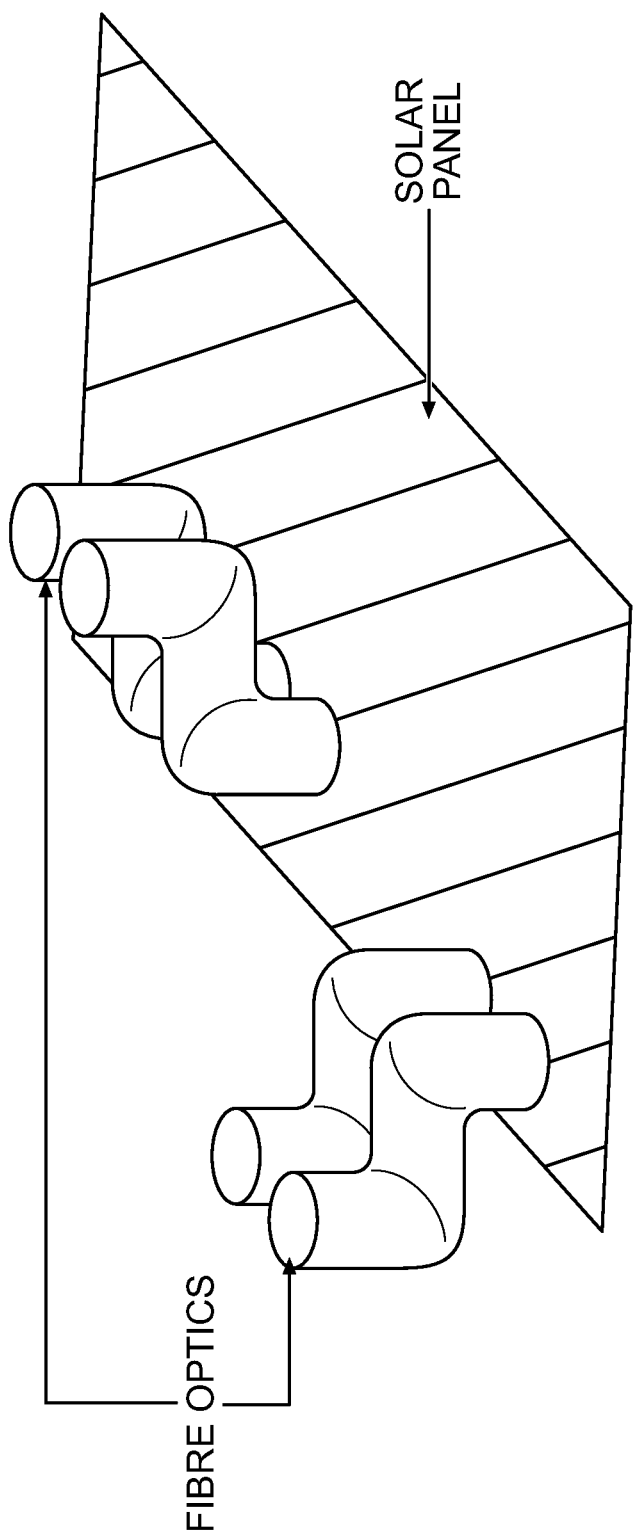
FIG. 5 depicts light transportation according to an embodiment of the present disclosure.
Figure 6D:
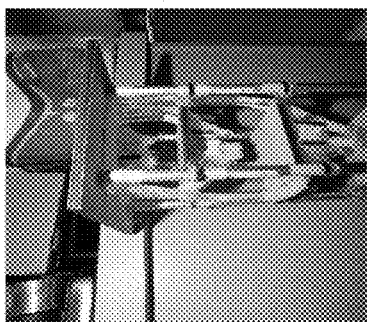
FIGS. 6A-6H depict a method for light transportation using a solar stack tower according to an embodiment of the present disclosure.
Figure 6C:
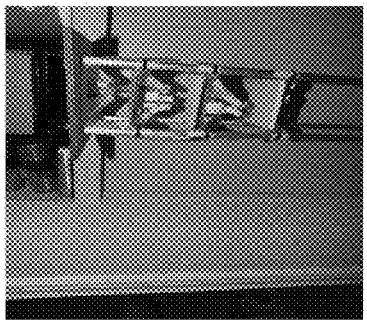
Figure 6B:
Figure 6A:
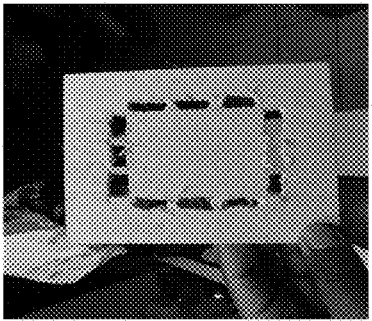
Figure 6H:
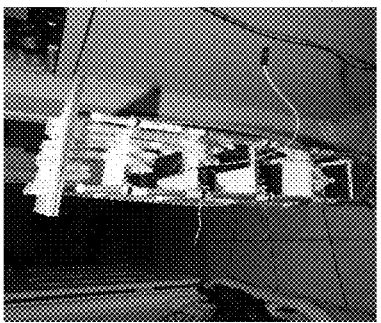
Figure 6G:
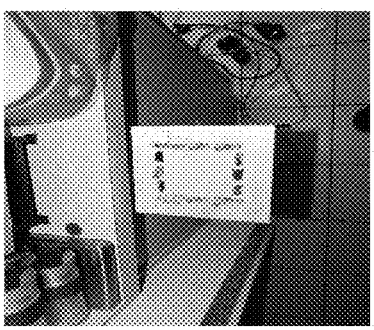
Figure 6F:
Figure 6E:
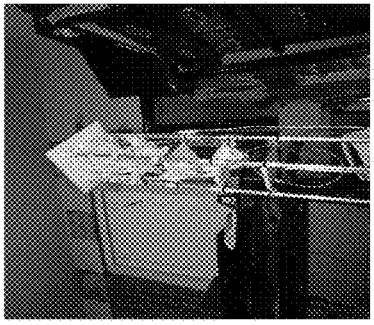

FIG. 5 depicts light transportation according to an embodiment of the present disclosure. Light can be transported from one area to another. This transportation can be done in several ways. Fiber optics may use total internal reflection to transport light from one end to another, and therefore, can be used to form a multi-layered solar stack tower. However, it should be appreciated that renewable forms of energy other than that which may be provided using solar panels may be used without departing from the present disclosure.

Internal reflection of light may transport light from one area to another in embodiments of the present disclosure as depicted in FIGS. 6A-6H. Fiber optics may enable light transmission through total internal reflection. Using the fibers, light may be collected from the top and distributed to the different sub-levels within the solar stack tower according to embodiments of the present disclosure. Each level within a solar stack tower according to embodiments of the present disclosure may include one solar panel, to make up a total of six levels and six solar panels. Each solar panel may include four fibers bundled together that may transmit light. The fibers may collect light from the top level and transmit it to the lower levels. While each level is described as including one solar panel with six levels in the solar stack tower, it should be appreciated that more than one solar panel may be provided per level and/or more or fewer levels may be provided in the solar stack tower without departing from the present disclosure. Similarly, while embodiments of the present disclosure may provide four fibers bundled per solar panel, it should be appreciated that more or fewer fibers may be bundled within a solar panel without departing from the present disclosure.

Embodiments of the present disclosure may be utilized in a variety of applications. A solar stack tower according to embodiments of the present disclosure may be adopted in utility, industrial, commercial, and/or residential scale energy generation and storage. A solar stack tower according to embodiments of the present disclosure may bring a new method of grid infrastructure, as it may reduce or even eliminate the need to generate electricity and transmit across long distances. Embodiments of the present disclosure also may be used in electric vehicles to create portable active generation mechanisms. Buildings may be constructed incorporating embodiments of the present disclosure to allow the solar panels within the walls of a building to actively generate electricity.

It should be appreciated that embodiments of the present disclosure may be used for solar photovoltaic and/or solar thermal applications and may provide an improved method to collect more solar radiation for use in future solar generating technologies. Reflection, refraction, and diffusion of light may be used to transport photons from an area of higher photon saturation to an area of lower photon saturation. This can also be described as the concentration of light. Embodiments of the present disclosure may solve the problems of cost associated with renewable energy. By using a lens/refractor or a combination of a lens/refractor and a reflector, a larger amount of light can be focused onto a smaller area of solar panel. The output of the solar panel can therefore be increased using a larger refractor and/or reflector.

In addition, embodiments of the present disclosure may transform two-dimensional area into three-dimensional lateral surface area so that solar energy collected is no more proportional to the two-dimensional base area of the panel, but the lateral surface area of the three-dimensional tower. Furthermore, the three-dimensional lateral surface area of the tower may be directly proportional to the height of the tower. As the tower becomes taller, it may collect more energy. Accordingly, energy output of the tower directly may be proportional to the height of the tower, as supposed to the two-dimensional area as is the case with regular solar technology. This may significantly reduce the amount of land required to produce solar energy.

Optical filtering may enable filtering out light rays that are not converted into energy. Solar panels can only convert light of certain frequencies and energies. Therefore, all other light rays that are not within this bandgap are wasted. This waste can come in the form of heat, which in the long run, may damage panels and limit their lifespan to 25 years. With optical filtering, unwanted rays may be filtered out by using special lenses or special reflectors. By successfully filtering out the unwanted rays, the lifespan of the panels may be increased by at least 10 years. This has major implications to the economics of solar energy, as an increased lifespan drastically reduces the levelized cost of producing solar energy.

Total internal reflection and secondary refraction can help boost the efficiency and output of systems according to embodiments of the present disclosure. In most cases, a significant amount of the light that hits panels is reflected away from panels. To increase the absorption, total internal reflection can be used to continually reflect light back toward the panel until it eventually absorbed. Furthermore, secondary refraction can be used to achieve an optimal absorption angle and to reduce the chances of the light rays being reflected away from the panel. Together, these two methods can greatly increase both system efficiency, as well as system output.

Active and passive tracking of the sun may always ensure maximum output. Accordingly, the system according to embodiments of the present disclosure may be completely solid state, and therefore require no moving parts. This can help reduce the cost of the system, as well as increase the lifespan of the system. Accordingly, a system according to embodiments of the present disclosure may mimic the orbit of the sun throughout the day, and passively track the sun no matter its angle, while using no moving parts. This may ensure a longer peak output, a higher peak output, and an extended daily and yearly output. Alternatively, the system according to embodiments of the present disclosure may be dynamic, for example, should high output be needed at all times. It should be appreciated that whether a tower is solid state or dynamic, the panels used with the tower may be monofacial or bifacial for stacking without departing from the present disclosure.

In other embodiments of the present disclosure, as a clean power source, the tower can also be equipped with carbon capture technology. The tower already produces its own energy, and some of that energy can therefore go towards capturing carbon from the atmosphere. The tower generates electricity using the sun and does not produce any carbon in the process. It is therefore a net zero carbon producing energy source. By adding carbon capture technology to it, the tower can become a net negative carbon producing technology, producing both clean, reliable, and resilient energy, while also removing carbon from the atmosphere.

Additional benefits of the technology according to embodiments of the present disclosure may include, but are not limited to, extended daily output, extended yearly output, higher peak output, reduced installation time, and/or reduced installation cost.

Figure 7B:
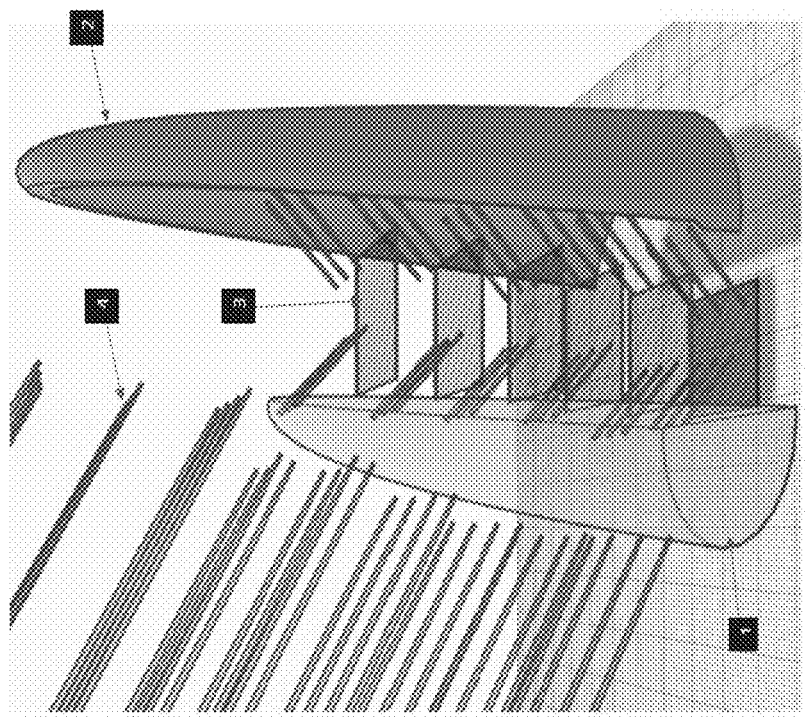
FIGS. 7A-7D depicts lens/reflector 1, reflector 2, solar panel 3, and light ray 4 according to an embodiment of the present disclosure.
Figure 7A:
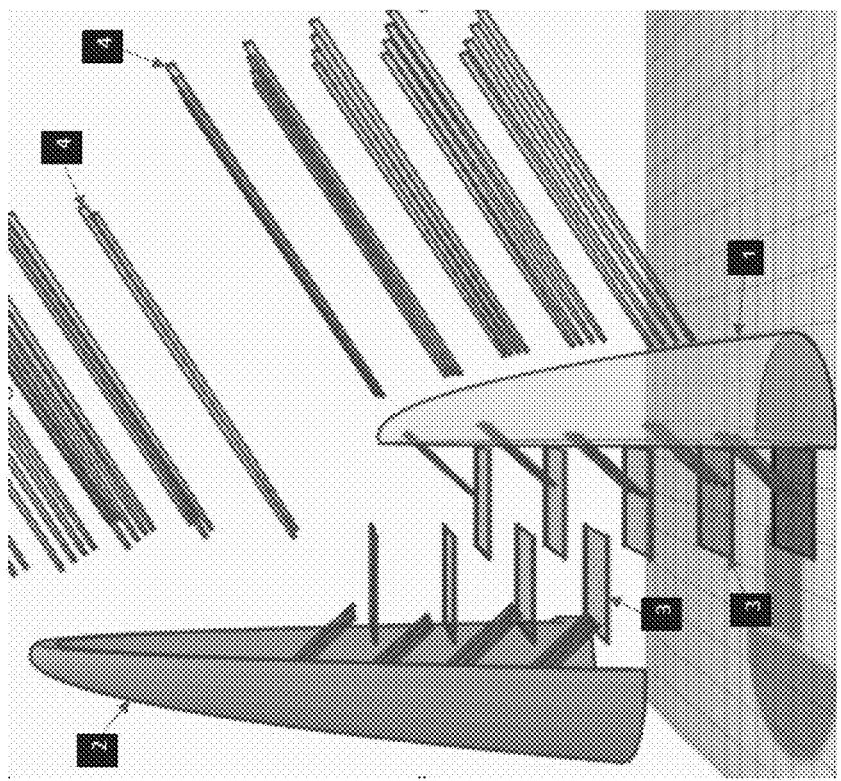
Figure 7D:
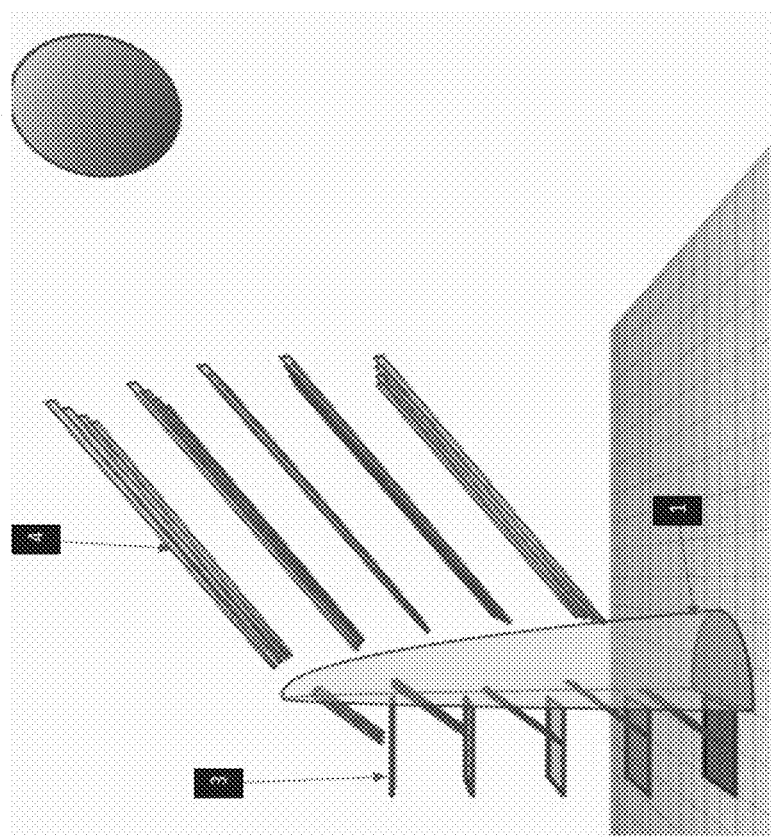
Figure 7C:
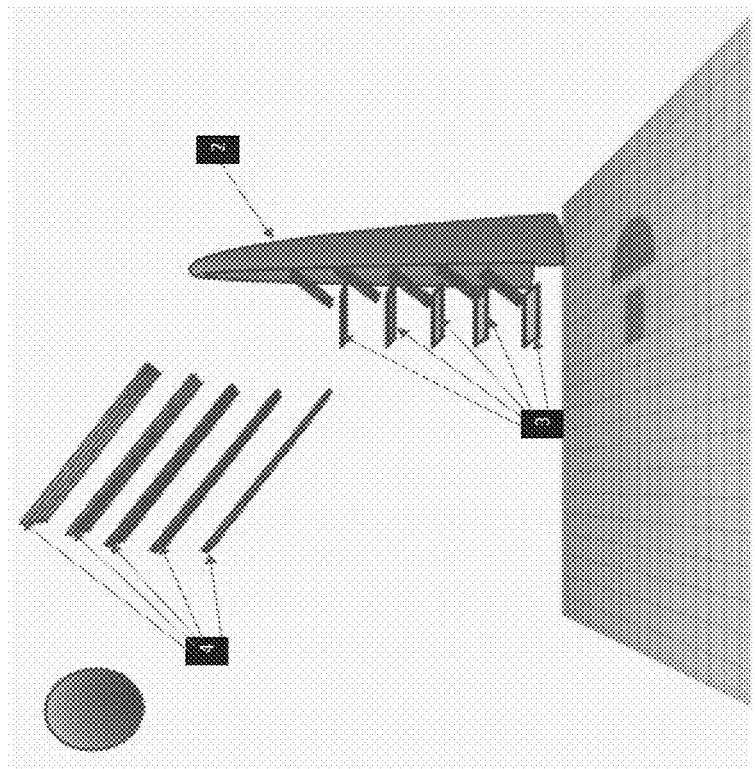
Figure 7G:
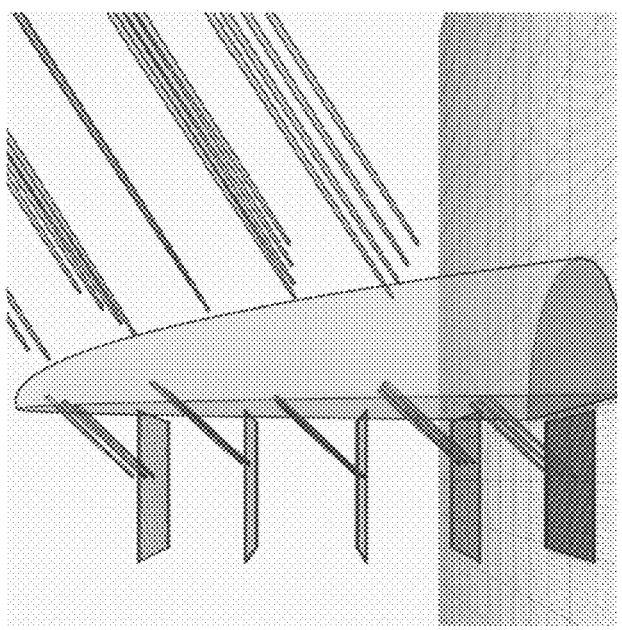
FIGS. 7E-G depict a refractor with panels from a back, front, and side view respectively according to an embodiment of the present disclosure.
Figure 7F:
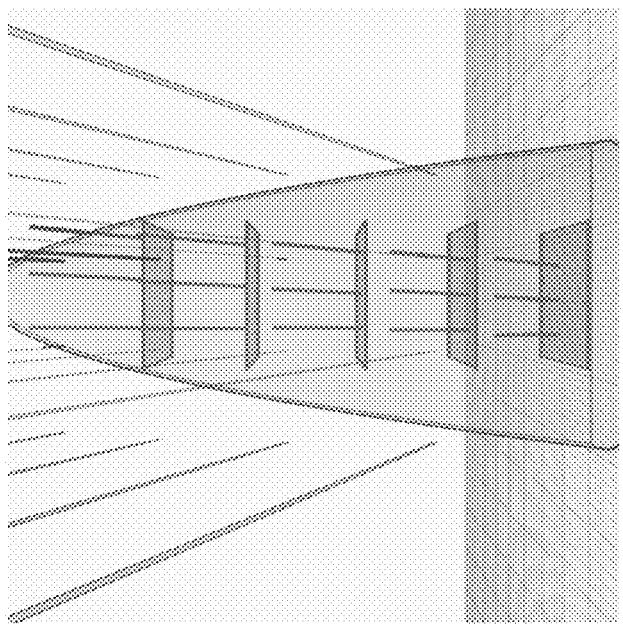
Figure 7E:
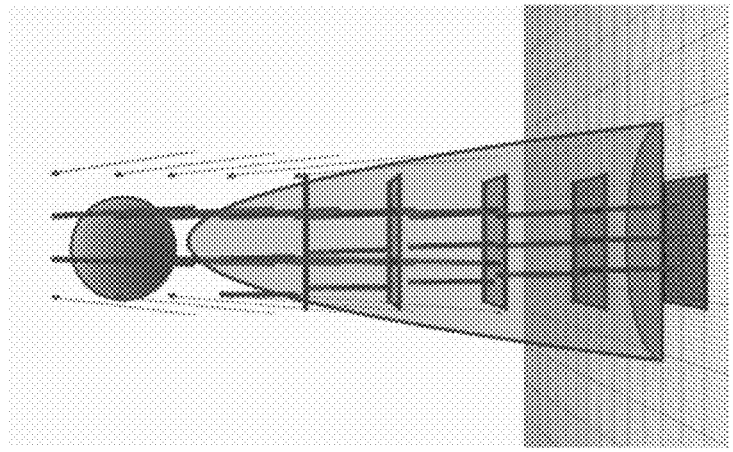

FIGS. 7A-7D depicts lens/refractor 1, reflector 2, solar panel 3, and light ray 4 according to an embodiment of the present disclosure. As depicted herein, the incoming light rays are both reflected and refracted towards the solar panels in the center. Lens/refractor 1 is in front of panel(s) 3. It therefore refracts the incoming rays behind it, while reflector 2 reflects the incoming rays in front of it. This combination can also be described as a concentration of light, as the combined surface area of the refractor and reflector can be bigger than the combined surface area of the panels. The result is that less solar panels may be required to produce the same energy, or equivalently, increasing the surface area of the reflector and refractor, can increase the output of the system. FIGS. 7E-G depict a refractor with panels from a back, front, and side view respectively.

Figure 8B:
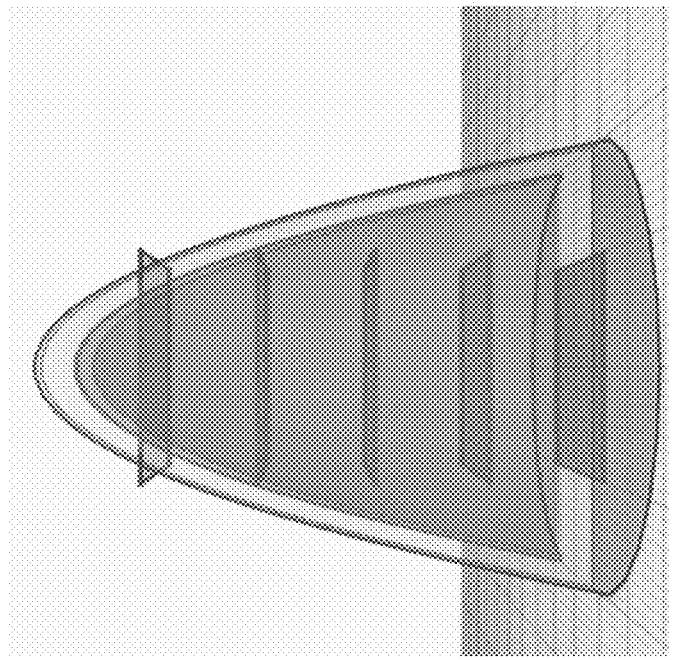
FIGS. 8A-C depicts a combination of a reflector and a refractor that may enclose the panels in the middle to form the tower according to an embodiment of the present disclosure.
Figure 8A:
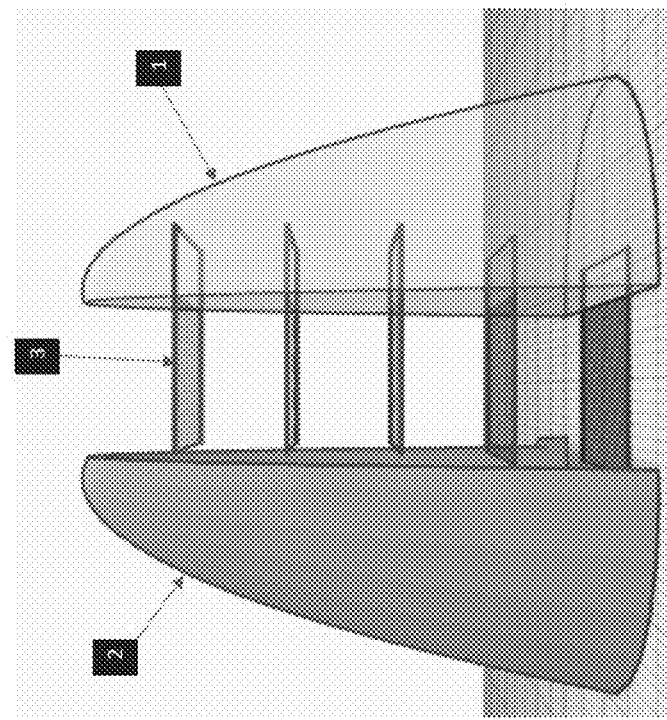
Figure 8C:
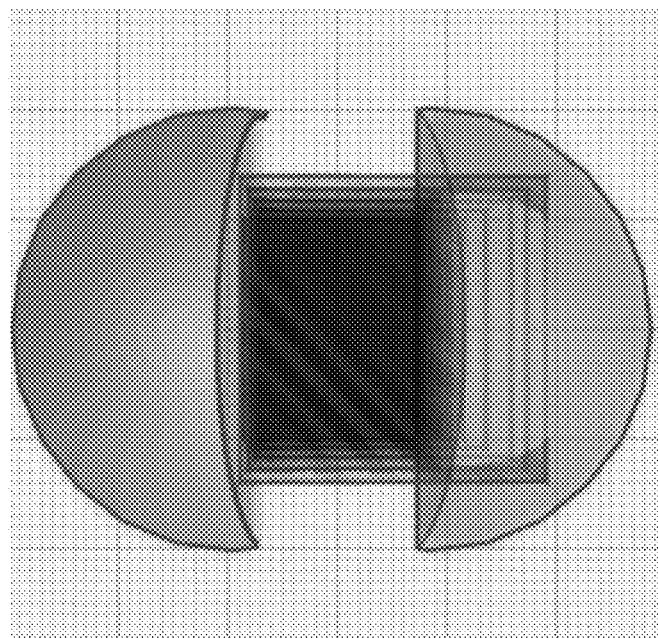
Figure 10B:
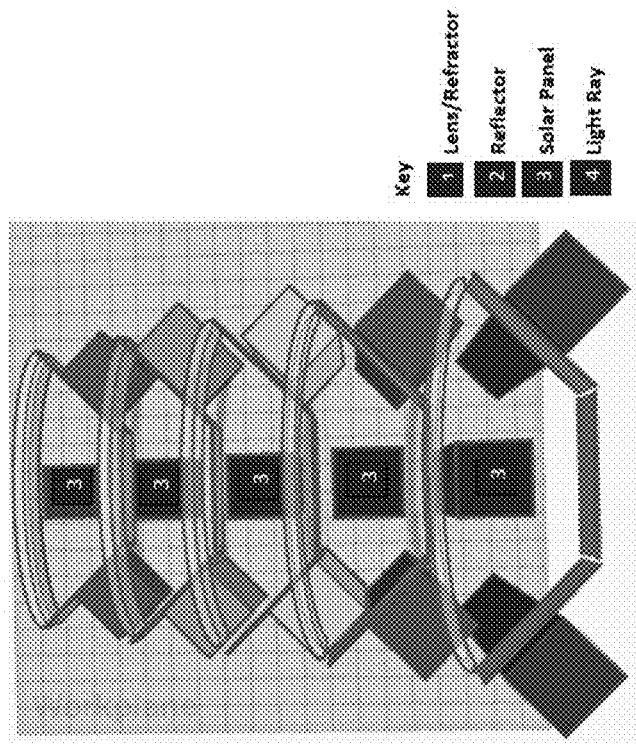
FIGS. 10A-F depict tower configurations according to embodiments of the present disclosure.
Figure 10A:
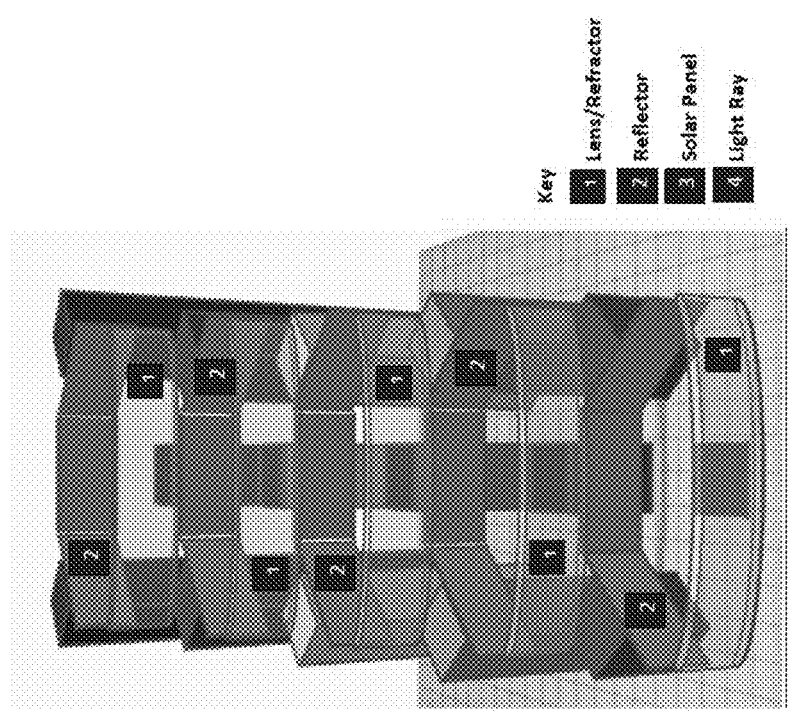
Figure 10D:
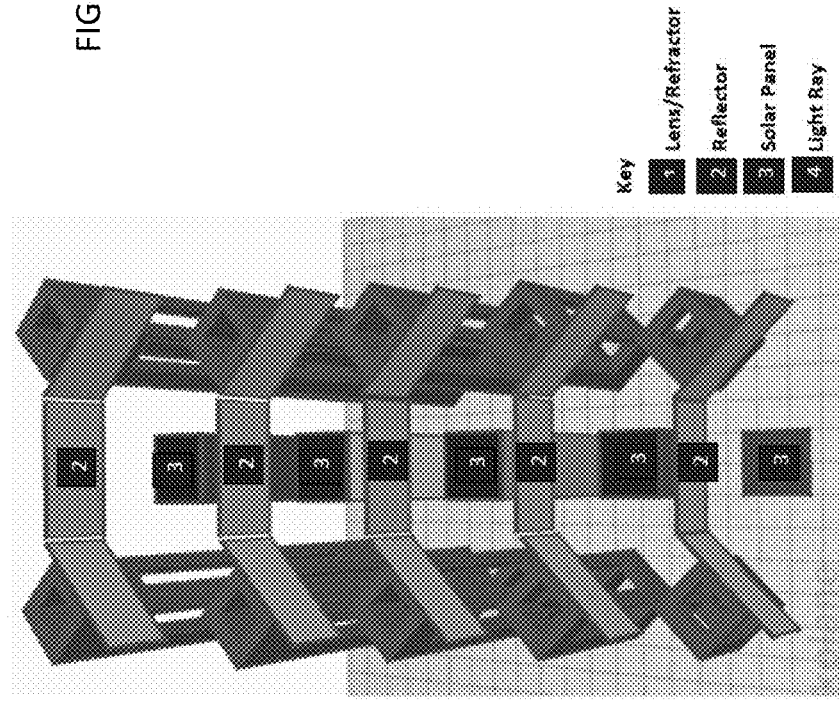
Figure 10C:
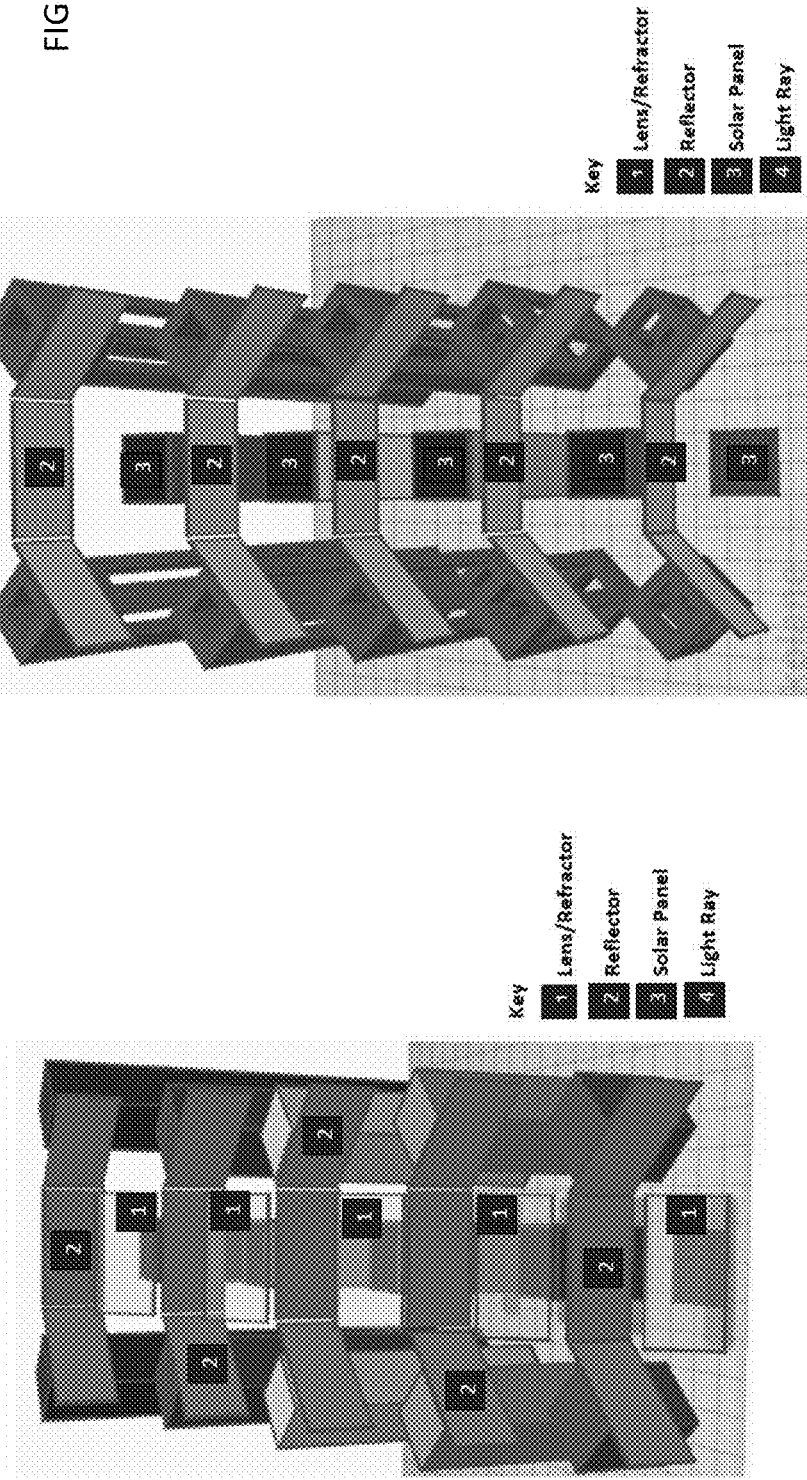
Figure 10F:
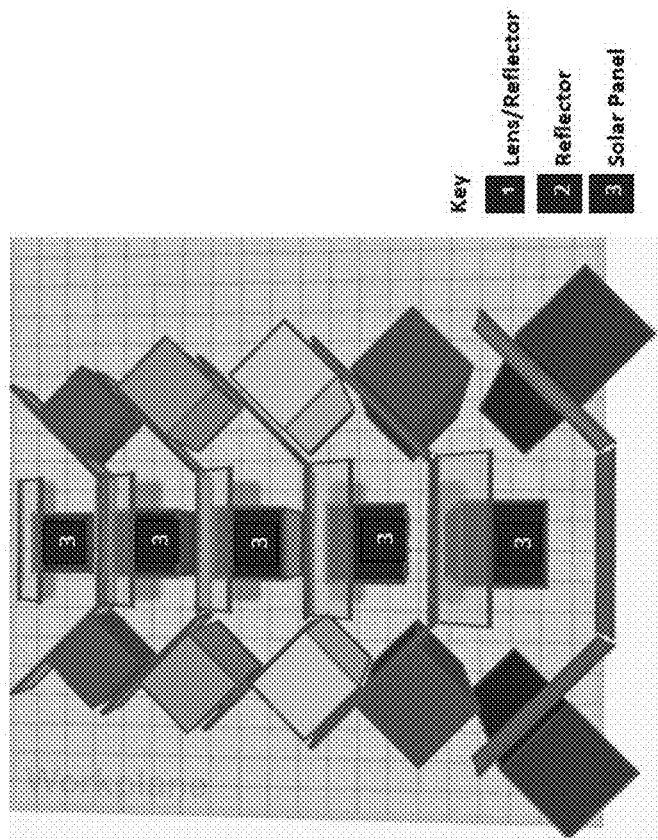
Figure 10E:
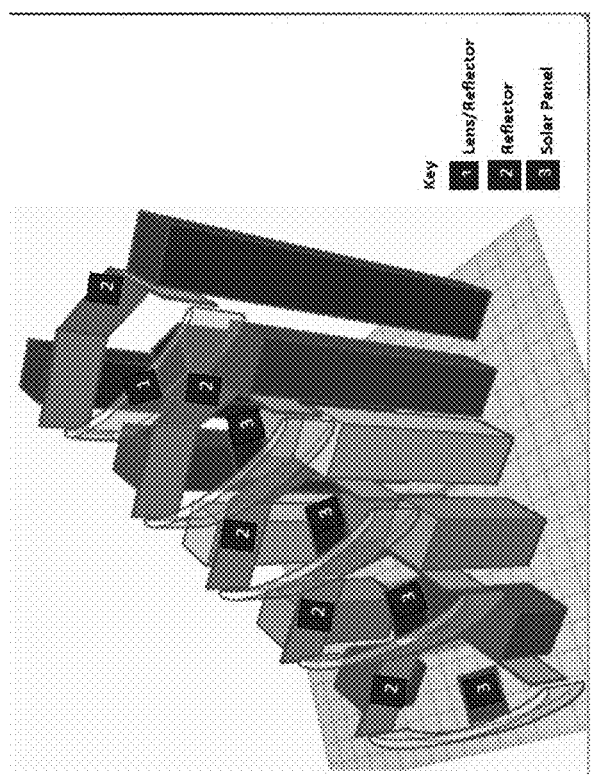

FIGS. 8A-C depicts a combination of a reflector and a refractor that may enclose the panels in the middle to form the tower according to an embodiment of the present disclosure. FIG. 12B depicts a front view, and FIG. 8C depicts a top view.

Figure 9:
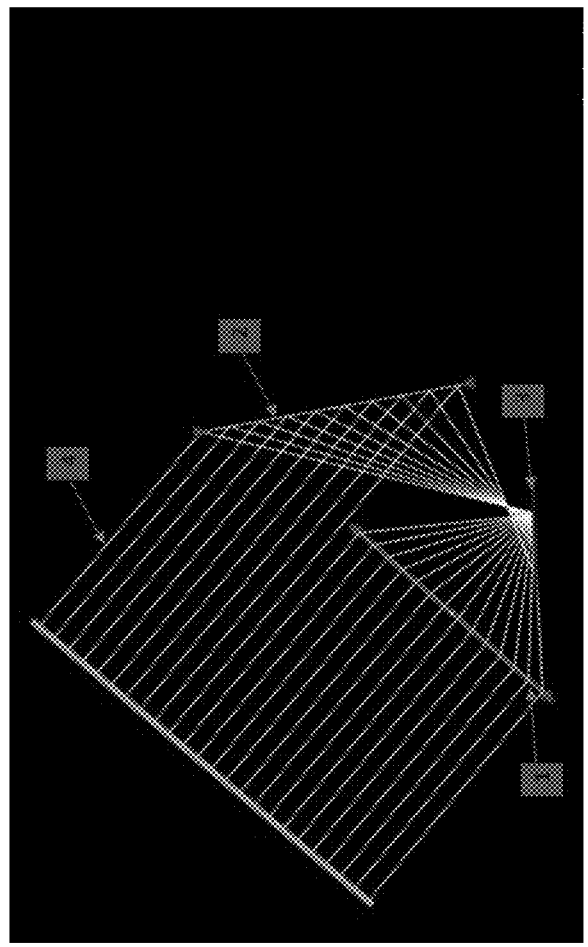
FIG. 9 depicts a two-dimensional illustration of the interaction of the light rays, the lens/refractor, and the reflector.

FIG. 9 depicts a two-dimensional illustration of the interaction of light rays 4, lens/refractor 1, and reflector 2. It demonstrates how an increased amount of light can be focused onto a smaller solar panel (panel 3). The combination of reflection and refraction may enable an equal distribution of light across panel 3. This is an important feature, as it may ensure maximum performance and output, while also ensuring that all then energy is not focused on a very small area of the panel, as this can burn the panel.

Figure 11A:
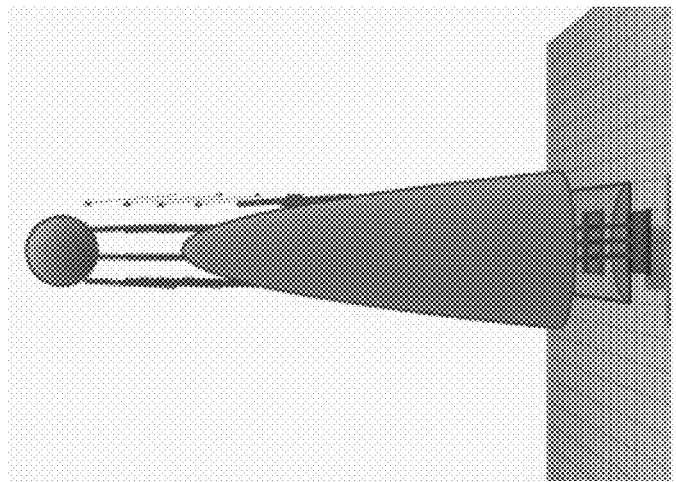
FIGS. 11A-C depict views of a first combination tower according to an embodiment of the present disclosure.
Figure 11B:
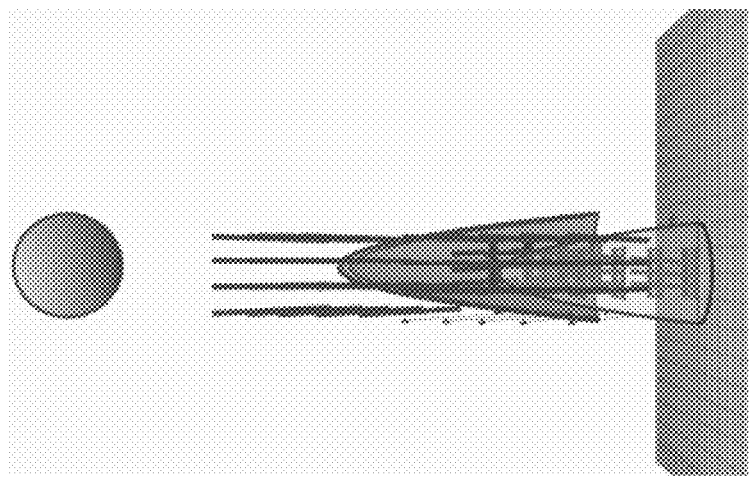
Figure 11C:
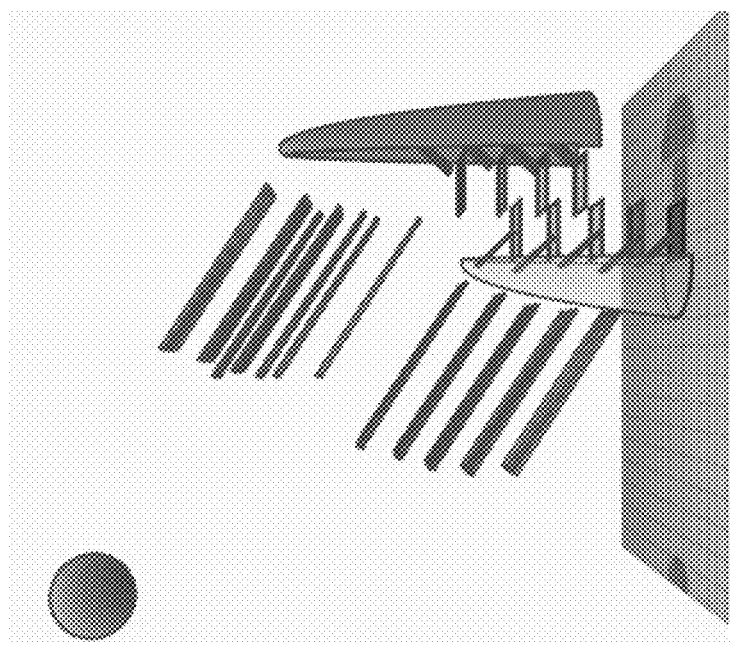

It should be appreciated that there may be side-by-side systems according to an embodiment of the present disclosure. A regular two-dimensional panel may be lying flat on the ground while a similar panel may be equipped with a reflector. FIGS. 10A-F depict tower configurations according to embodiments of the present disclosure. These tower configurations may use reflection, refraction, or a combination of both to increase output, extend output, and/or track the sun's orbit. FIG. 11A depicts a back view of a first combination tower. FIG. 11B depicts a front view of a first combination tower. FIG. 11C depicts a side view of a first combination tower. Other combination towers may be utilized with the first combination tower.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A poly-layered, poly-dimensional solar stack tower comprising:
    a plurality of solar panels stacked on top of one another at an angle relative to one another, the plurality of solar panels on the x-y axis;
    at least one lens/refractor positioned in front of the plurality of solar panels to refract incoming light rays behind the at least one lens/refractor; and
    at least one reflector that reflects the incoming light rays in front of the at least one reflector,
    wherein the at least one lens/refractor and the at least one reflector are on the z axis and enclose the plurality of solar panels to form the solar stack tower, and
    wherein the incoming light rays are both reflected and refracted toward the plurality of solar panels as uni-directional light, thereby concentrating the light rays.

2. The tower of claim 1, wherein the solar stack tower is entirely solid state with no moving parts.

3. The tower of claim 1, wherein the solar stack tower is dynamic.

4. The tower of claim 1, wherein the plurality of solar panels are monofacial or bifacial.

5. The tower of claim 1, wherein the solar stack tower provides an enclosed structure, protecting and insulating the plurality of solar panels from heat, moisture, dust, and other damaging elements.

6. The tower of claim 1, wherein the tower is portable.

7. The tower of claim 1 further comprising:
    at least one side collector lens that converges light onto a bottom solar panel of the plurality of solar panels; and
    at least one top collector lens that converges light onto the bottom solar panel.

8. The tower of claim 1, wherein the tower utilizes fiber optics to collect light from a top panel of the plurality of solar panels and distribute to the other panels of the plurality of solar panels.

9. The tower of claim 8, wherein each of the plurality of solar panels includes four fibers bundled together to transmit light.

10. The tower of claim 1 further comprising:
    carbon capture technology to convert the tower to a net negative carbon producing technology, producing both clean, reliable, and resilient energy, while also removing carbon from the atmosphere.

11. A poly-layered, poly-dimensional solar stack tower comprising:
    a plurality of solar panels stacked on top of one another at an angle relative to one another, the plurality of solar panels on the x-y axis; and
    a plurality of reflectors on the z axis and forming a solar stack tower around the plurality of solar panels, wherein the plurality of reflectors reflect the incoming light rays in front of the plurality of reflectors,
    wherein one of the plurality of solar panels and one of the plurality of refractors form a level of the solar stack tower and multiple levels are stacked at an angle, and
    wherein the plurality of solar panels and the plurality of reflectors directly face the sun.

12. The tower of claim 11 further comprising:
    a plurality of lenses/refractors positioned in front of the plurality of solar panels to refract incoming light rays behind the plurality of lenses/refractors, wherein the plurality of reflectors and the plurality of lenses/refractors enclose the plurality of solar panels to form the solar stack tower, and wherein the incoming light rays are both reflected and refracted toward the plurality of solar panels as uni-directional light, thereby concentrating the light rays.

13. The tower of claim 12, wherein the solar stack tower is entirely solid state with no moving parts.

14. The tower of claim 12, wherein the solar stack tower is dynamic.

15. The tower of claim 12, wherein the plurality of solar panels are monofacial or bifacial.

16. The tower of claim 12, wherein the tower is portable.

17. The tower of claim 12 further comprising:
    at least one side collector lens that converges light onto a bottom solar panel of the plurality of solar panels; and
    at least one top collector lens that converges light onto the bottom solar panel.

18. The tower of claim 12, wherein the tower utilizes fiber optics to collect light from a top panel of the plurality of solar panels and distribute to the other panels of the plurality of solar panels.

19. A poly-layered, poly-dimensional solar stack structure comprising:
    a plurality of solar panels stacked on top of one another at an angle relative to one another, the plurality of solar panels on the x-y axis;
    at least one lens/refractor to refract incoming light rays behind the at least one lens/refractor; and
    at least one reflector that reflects the incoming light rays in front of the at least one reflector,
    wherein the at least one lens/refractor and the at least one reflector are on the z axis, and
    wherein the incoming light rays are both reflected and refracted toward the plurality of solar panels as uni-directional light, thereby concentrating the light rays.

20. The structure of claim 19, wherein the structure is in tower form.

* * * * *